United States Patent [19]
Brown et al.

[11] Patent Number: 5,805,086
[45] Date of Patent: *Sep. 8, 1998

[54] METHOD AND SYSTEM FOR COMPRESSING DATA THAT FACILITATES HIGH-SPEED DATA DECOMPRESSION

[75] Inventors: Jeffrey Douglas Brown; Scott Douglas Clark, both of Rochester, Minn.; Michael Kay Edwards, Mesa, Ariz.; Daniel Frank Moertl, Rochester, Minn.

[73] Assignee: International Business Machines Corporation, Armonk, N.Y

[ * ] Notice: The term of this patent shall not extend beyond the expiration date of Pat. No. 5,778,255.

[21] Appl. No.: 541,779

[22] Filed: Oct. 10, 1995

[51] Int. Cl.⁶ ........................................ G06F 5/00
[52] U.S. Cl. .............................. 341/51; 341/50
[58] Field of Search .................. 341/51, 50, 67, 341/65, 87

[56] References Cited

U.S. PATENT DOCUMENTS

| | | | |
|---|---|---|---|
| 4,021,782 | 5/1977 | Hoerning | 340/172.5 |
| 4,558,302 | 12/1985 | Welch | 340/347 |
| 4,814,746 | 3/1989 | Miller et al | 341/95 |
| 4,876,541 | 10/1989 | Storer | 341/51 |
| 4,899,147 | 2/1990 | Schiavo et al. | 341/60 |
| 4,988,998 | 1/1991 | O'Brien | 341/55 |
| 5,001,478 | 3/1991 | Nagy | 341/67 |
| 5,010,345 | 4/1991 | Nagy | 341/65 |
| 5,023,610 | 6/1991 | Rubow et al. | 341/51 |
| 5,049,881 | 9/1991 | Gibson et al. | 341/95 |
| 5,051,745 | 9/1991 | Katz | 341/51 |
| 5,058,137 | 10/1991 | Shah | 375/94 |
| 5,136,289 | 8/1992 | Yoshida et al. | 341/67 |
| 5,150,430 | 9/1992 | Chu | 382/56 |
| 5,155,484 | 10/1992 | Chambers, IV | 341/55 |
| 5,167,034 | 11/1992 | MacLean, Jr. et al. | 395/575 |
| 5,179,378 | 1/1993 | Ranganathan et al. | 341/51 |
| 5,184,126 | 2/1993 | Nagy | 341/67 |
| 5,206,935 | 4/1993 | Sinks et al. | 395/275 |
| 5,258,910 | 11/1993 | Kanza et al. | 364/419.1 |
| 5,347,650 | 9/1994 | Arditti et al. | 395/600 |
| 5,353,024 | 10/1994 | Graybill | 341/51 |
| 5,369,605 | 11/1994 | Parks | 364/755.09 |
| 5,394,534 | 2/1995 | Kulakowski et al. | 395/425 |
| 5,406,279 | 4/1995 | Anderson et al. | 341/51 |
| 5,406,534 | 4/1995 | Anderson et al. | 341/51 |
| 5,410,671 | 4/1995 | Elgamal et al. | 395/425 |
| 5,463,390 | 10/1995 | Whiting et al. | 341/51 |
| 5,572,209 | 11/1996 | Farmer et al. | 341/67 |
| 5,627,534 | 5/1997 | Craft | 341/87 |

*Primary Examiner*—Marc S. Hoff
*Assistant Examiner*—Peguy JeanPierre
*Attorney, Agent, or Firm*—Felsman, Bradley, Gunter & Dillon

[57] ABSTRACT

In a data processing system, data from an input buffer is compressed to produce a compressed data set in a compressed data buffer, wherein the compressed data set has a Lempel-Ziv compressed data format having raw-byte tokens and string tokens. The string tokens in the compressed data set each have a predetermined number of bits, thereby facilitating efficient, high-speed parsing of tokens during subsequent decompression of the compressed data set. In some embodiments, the raw-byte tokens and the string tokens have the same predetermined number of bits.

18 Claims, 11 Drawing Sheets

METHOD AND SYSTEM FOR COMPRESSING DATA THAT FACILITATES HIGH-SPEED DATA DECOMPRESSION

CROSS-REFERENCE TO RELATED APPLICATIONS

This application is related to copending application, Docket No. R09-95-073, Ser. No. 08/540,523, entitled "Method and System in a Data Processing System for Decompressing Multiple Compressed Bytes in a Single Machine Cycle," filed of even date herewith, assigned to the assignee herein, and incorporated herein by reference.

BACKGROUND OF THE INVENTION

1. Technical Field

The present invention relates in general to an improved data processing system, and in particular to a method and system for compressing data. More particularly, the present invention relates to a method and system for compressing data to produce a compressed data file that facilitates efficient parsing during data decompression.

2. Description of the Related Art

Data compression is used to reduce data storage requirements and/or data communication costs by reducing the redundancy in a data set. Thus, when compressed, the size of the physical representation of the data set is reduced, while the relevant information in the data set is preserved.

After data compression has reduced the size of a data set without losing any of the original information, compressed data must eventually be decompressed in order to extract the original information. An example of a known compression and decompression scheme is the Lempel-Ziv algorithm. Lempel-Ziv, or LZ, data compression is accomplished by mapping an input data stream into a different, compact, output data stream.

During LZ-type data compression, an input data stream, treated as a predetermined sequence of 8-bit bytes, is mapped into a compressed output data stream, consisting of a sequence of "tokens" in a similar predetermined sequence. These tokens (except for some handshaking-type overhead) are either "raw-byte tokens" or "string tokens." A raw-byte token is essentially a byte of the input data stream that has not been altered or compressed to represent anything other than the original byte input into the compression algorithm.

String tokens, however, include two parts: a "length" and a "pointer." Such a pointer may also be referred to as a "displacement" or a "history buffer address." The string token is utilized to represent more than one byte of input data, wherein the length part of the string token is equal to the number of input bytes represented by the string token. The pointer part of the string token points to a location in a "history buffer" which stores the uncompressed input data represented by the string token.

During operation, the encoder (i.e., the compression algorithm) and the decoder (i.e., the decompression algorithm) build and maintain identical data structures called "history buffers." Such history buffers store the most recently processed data bytes. During data compression, each data byte is sequentially stored in a history buffer. As new input bytes are compressed, the data in the history buffer is examined for a sequence of data that matches a sequence currently being input into the compression algorithm. As input bytes continue to match a sequence previously stored in the history buffer, the compression algorithm records the length of the matching sequence and the location of the matching sequence in the history buffer. At the output of the compression algorithm, a string token is used to point to the beginning of the matching sequence in the history buffer, and the length part of the string token represents the length of the matching string in the history buffer. Accordingly, a single string token that may represent many bytes of original data is output by the compression algorithm.

In LZ-type data decompression, each decompressed byte of data is similarly sequentially loaded into a history buffer maintained by the decompression algorithm. For example, as the decompression algorithm receives raw-byte tokens, original data is extracted from the raw-byte token and output by the decompression algorithm, and it is also recorded in the history buffer. As string tokens are received by the decompression algorithm, a number of bytes determined by the length part of the string token is read out of the history buffer from a location in the history buffer pointed to by the pointer. As these bytes are read from the history buffer and output by the decompression algorithm, they are also re-written back into the history buffer. Thus, the decompression algorithm recovers the original input data stream and maintains a history buffer that matches the history buffer that was maintained by the compression algorithm during compression.

Common history buffer sizes used during compression and decompression are 512 bytes, 1024 bytes, and 2048 bytes. Because history buffer size is a design choice, other sizes may be selected.

With regard to the length part of the string token, known implementations of the LZ algorithm use a variable number of bits. The pointer part of the string token includes a number of bits necessary to address all bytes in the history buffer. Such a pointer part typically has a fixed length, but may also have a variable length in some implementations. Raw-byte tokens may include extra bits for differentiating raw-byte tokens from string tokens during decompression. For data integrity checking, a CRC, check sum or similar error detection code may be appended to a compressed data set.

In prior art LZ-type decompression algorithms, one byte of data was decompressed for every clock cycle or machine cycle. The advantage of decompressing one byte per cycle is that the history buffer is easily maintained and is always current. The history buffer may be referred to as "current" if the last byte decompressed has been written into the history buffer as the next byte is being decompressed. Such a single-byte decompression algorithm is suitable for applications that can wait for the data to be decompressed, but there are some applications that need faster data compression. Examples of applications needing faster decompression rates include a "write cache," or applications that have more read operations than write operations. In another example, main storage or main memory in a data processing system may store data in a compressed format. Because the CPU typically waits for main memory to recall data, performance of the data processing system may be based on the speed of decompression of compressed data stored in main memory.

Thus, as data decompression algorithms are utilized in time-critical stages of data processing, data decompression becomes a bottleneck that reduces overall performance of a data processing system. And, during such data decompression, valuable time is spent parsing raw-byte tokens and string tokens when tokens are input to the decompression process. This parsing process involves determining what bits of a compressed data set belong to individual raw-byte tokens and string tokens.

Because raw-byte tokens may contain a different number of bits than string tokens, and because one string token may contain a different number of bits than another string token, the parsing operation that separates one token from another is complex and relatively slow. Complexity of such token parsing operations is further increased by new data decompression technology that may require multiple tokens to be input to the data decompression system during a single cycle in order to support the output of multiple decompressed bytes during a single cycle. Therefore, a need exists for a method and system for compressing data to produce a compressed data file that facilitates efficient, high-speed parsing during subsequent data decompression.

SUMMARY OF THE INVENTION

It is therefore one object of the present invention to provide an improved data processing system.

It is another object of the present invention to provide a method and system for compressing data.

It is yet another object of the present invention to provide a method and system for compressing data to produce a compressed data file that facilitates efficient parsing during data decompression.

The foregoing objects are achieved as is now described. In a data processing system, data from an input buffer is compressed to produce a compressed data set in a compressed data buffer, wherein the compressed data set has a Lempel-Ziv compressed data format having raw-byte tokens and string tokens. The string tokens in the compressed data set each have a predetermined number of bits, thereby facilitating efficient, high-speed parsing of tokens during subsequent decompression of the compressed data set. In some embodiments, the raw-byte tokens and the string tokens have the same predetermined number of bits.

BRIEF DESCRIPTION OF THE DRAWINGS

The novel features believed characteristic of the invention are set forth in the appended claims. The invention itself however, as well as a preferred mode of use, further objects and advantages thereof, will be understood by reference to the following detailed description of an illustrative embodiment when read in conjunction with the accompanying drawings, wherein:

DETAILED DESCRIPTION OF THE PREFERRED EMBODIMENT

Figure 1:
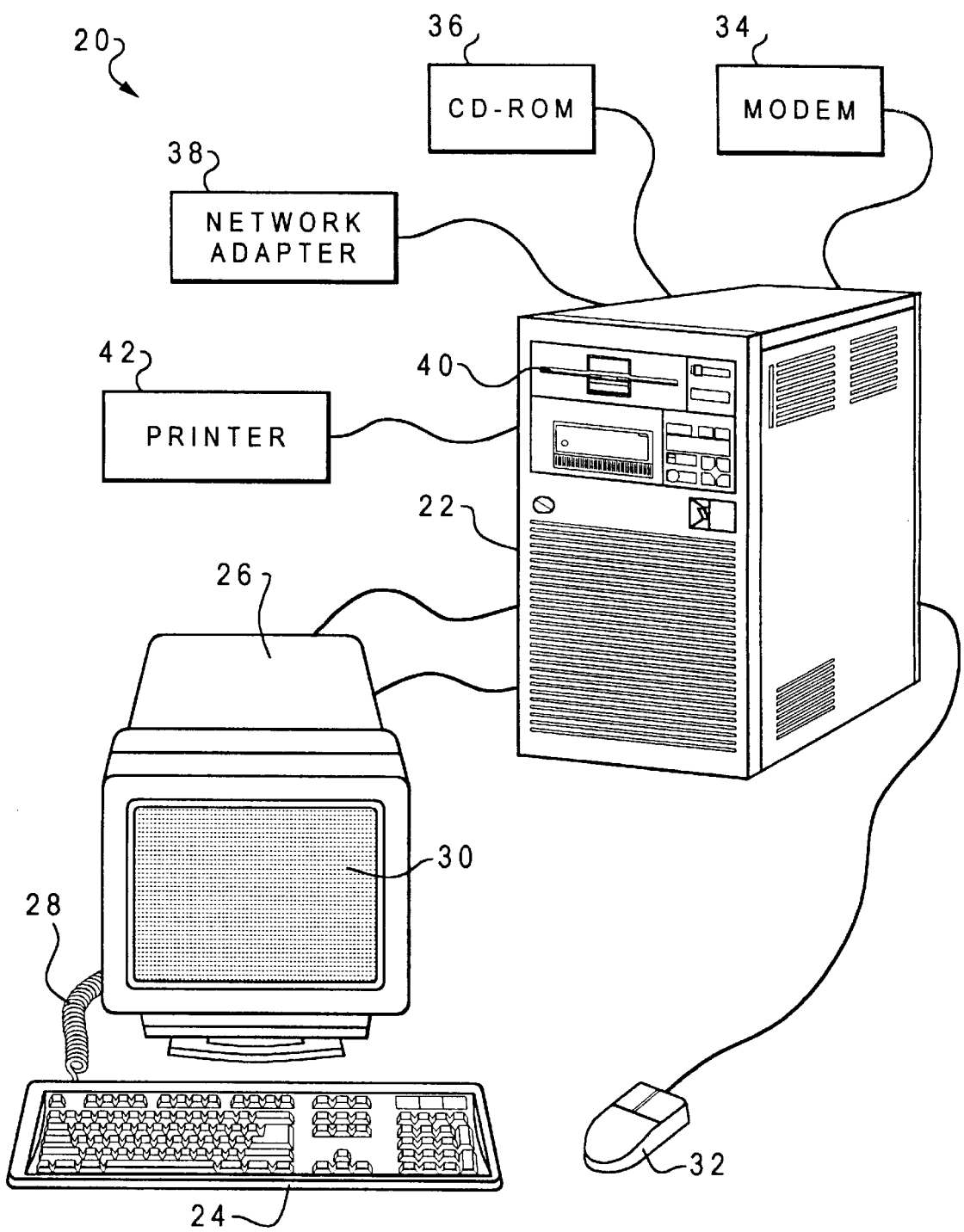
FIG. 1 depicts a data processing system for compressing and decompressing data in accordance with the method and system of the present invention.

With reference now to the figures, and in particular to FIG. 1, there is depicted a data processing system 20, which includes processor 22, keyboard 24, and display 26. Keyboard 24 is coupled to processor 22 by a cable 28. Display 26 includes display screen 30. Data processing system 20 may also include pointing device 32. Processor 22 may also be coupled to one or more peripheral devices, such as modem 34, CD-ROM 36, network adaptor 38 and floppy disk drive 40, each of which may be internal or external to the enclosure of processor 22. An output device such as printer 42 may also be coupled to processor 22.

Those persons skilled in the art of data processing systems design should recognize that display 26, keyboard 24, and pointing device 32 may each be implemented utilizing any one of several known off-the-shelf components. Data processing system 20 may be implemented utilizing any general purpose computer.

Figure 2:
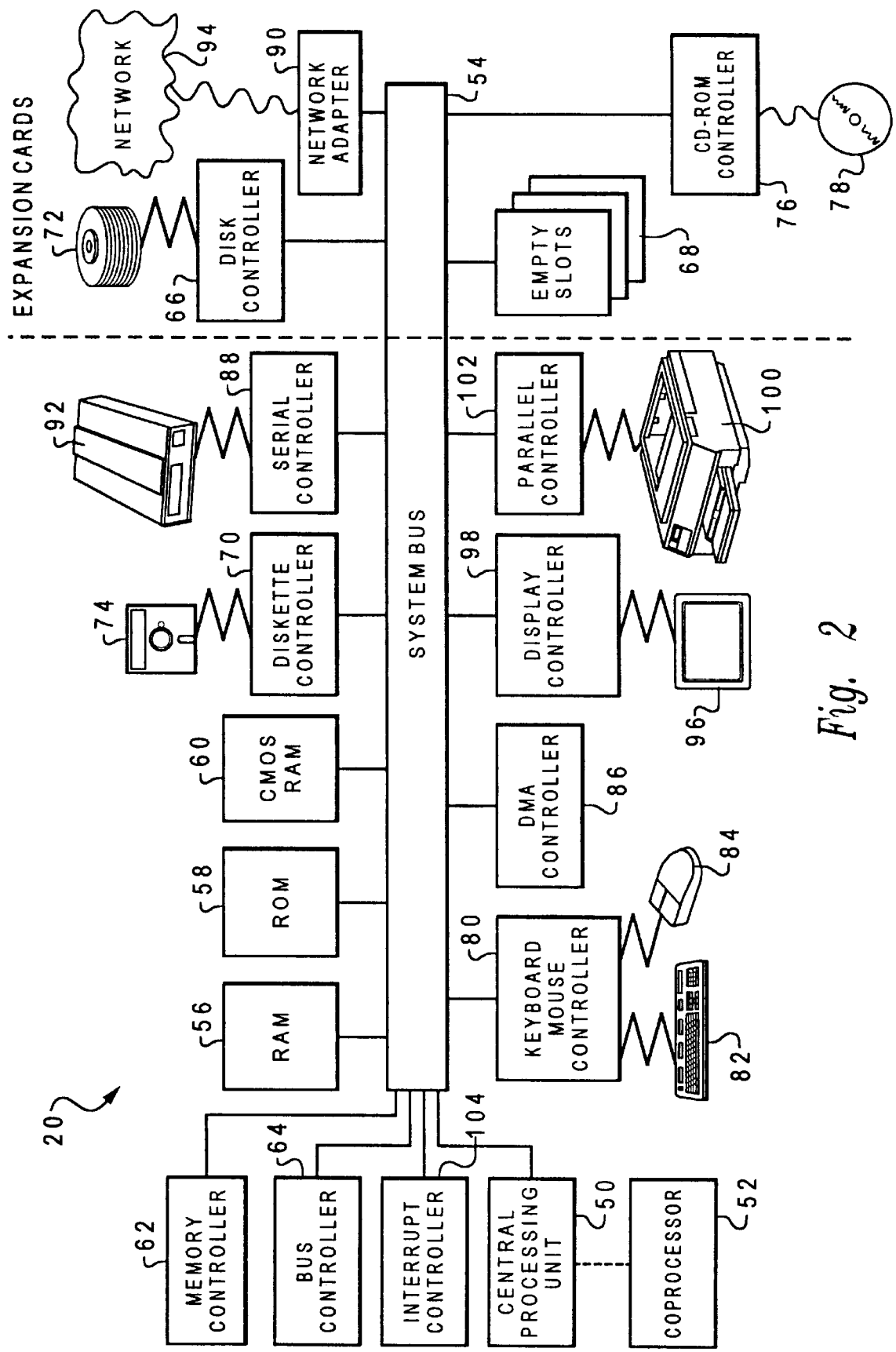
FIG. 2 is a more detailed high-level block diagram which further illustrates the major components of the data processing system of FIG. 1.

With reference now to FIG. 2, there is depicted a high-level block diagram which further illustrates the major components that may be included in data processing system 20 of FIG. 1. Data processing system 20 is controlled primarily by computer readable instructions, which may be in the form of software, wherever, or by whatever means such software is stored or accessed. Such software may be executed within central processing unit (CPU) 50 to cause data processing system 20 to do work.

Coprocessor 52 is an optional processor, distinct from main CPU 50, that performs additional functions or assists CPU 50.

CPU 50 fetches, decodes, and executes instructions, and transfers information to and from other resources via the computer's main dataPage transfer path, system bus 54. Such a system bus connects the components in data processing system 20 and defines the medium for data exchange. System bus 54 typically includes data lines for sending data, address lines for sending addresses, and control lines for sending interrupts and for operating the system bus.

Memory devices coupled to system bus 54 may include random access memory (RAM) 56, read only memory (ROM) 58, and nonvolatile memory 60. Such memories include circuitry that allows information to be stored and retrieved. ROMs contain stored data that cannot be modified. Data stored in RAM can be read or changed by CPU 50 or other hardware devices, and, according to the present invention, data may be stored in a compressed form. Nonvolatile memory is memory that does not lose data when power is removed from it. Nonvolatile memories include ROM, EPROM, flash memory, bubble memory, or battery-backed CMOS RAM. As shown in FIG. 2, such battery-backed CMOS RAM may be utilized to store system configuration information.

Access to RAM 56, ROM 58, and nonvolatile memory 60 may be controlled by memory controller 62 and bus controller 64. Memory controller 62 may provide an address translation function that translates virtual addresses into physical addresses as instructions are executed. Memory controller 62 may also provide a memory protection function that isolates processes within the system and isolates system processes from user processes.

If, according to the present invention, data is stored in memory in a compressed format, a method and system described herein may be employed to decompress data as such data is retrieved from RAM 56 or from other data sources in data processing system 20.

An expansion card or expansion board is a circuit board that includes chips and other electronic components connected in a circuit that adds functions or resources to the computer. Typical expansion cards add memory, disk-drive controllers 66, video support, parallel and serial ports, and internal modems. Thus, empty slots 68 may be used to receive various types of expansion cards.

Disk controller 66 and diskette controller 70 both include special-purpose purpose integrated circuits and associated circuitry that direct and control reading from and writing to a hard disk drive 72 and a floppy disk or diskette 74, respectively. Such disk controllers handle tasks such as positioning read/write head, mediating between the drive and the microprocessor, and controlling the transfer of information to and from memory. A single disk controller may be able to control more that one disk drive.

CD-ROM controller 76 may be included in data processing 20 for reading data from CD-ROMs 78 (compact disk read-only memory). Such CD-ROMs use laser optics rather than magnetic means for reading data.

Keyboard mouse controller 80 is provided in data processing system 20 for interfacing with keyboard 82 and a pointing device, such as mouse 84. Such pointing devices are typically utilized to control an on-screen element, such as a cursor, which may take the form of an arrow having a hot spot that specifies the location of the pointer when the user presses a mouse button.

Direct memory access (DMA) controller 86 may be used to provide a memory access that does not involve CPU 50. Such memory accesses are typically employed for data transfer directly between memory and an "intelligent" peripheral device, such as between memory 56 and disk controller 66.

Communication between data processing system 20 and other data processing systems may be facilitated by serial controller 88 and network adaptor 90, both of which are coupled to system bus 54. Serial controller 88 is utilized to transmit information between computers, or between a computer and peripheral devices, one bit at a time over a single line. Serial communications can be synchronous (controlled by some time standard such as a clock) or asynchronous (managed by the exchange of control signals that govern the flow of information).

As illustrated, such a serial interface may be utilized to communicate with modem 92. A modem is a communications device that enables a computer to transmit information over a standard telephone line. Modems convert digital computer signals to analog signals suitable for communication over telephone lines. Modem 92 may be utilized to connect data processing system 20 to an on-line information service. Such an on-line service provider may offer software which may be downloaded into data processing system 20 via modem 92. Modem 92 may provide a connection to other sources of software, such as a server, an electronic bulletin board, and the Internet or World Wide Web.

Network adaptor 90 may be used to connect data processing system 20 to a local area network 94. Network 94 may provide computer users with means of communicating and transferring software and information electronically. Additionally, network 94 may provide distributed processing, which involves several computers and the sharing of workloads or cooperative efforts in performing a task.

Display 96, which is controlled by display controller 98, is used to display visual output generated by data processing system 20. Such visual output may include text, graphics, animated graphics, and video. Display controller 98 includes electronic components required to generate a video signal that is sent to display 96.

Printer 100 may be coupled to data processing system 20 via parallel controller 102. Printer 100 is used to put text or a computer-generated image on paper or on another medium. Other types of printers may include an imagesetter, a plotter, or a film recorder.

Parallel controller 102 is used to send multiple data and control bits simultaneously over wires connected between system bus 54 and another parallel communication device, such as printer 100.

During data processing operations, the various devices connected to system bus 54 may generate interrupts which are processed by interrupt controller 104. An interrupt is a request for attention from CPU 50 that can be passed to CPU 50 by either hardware or software. An interrupt causes the microprocessor to suspend currently executing instructions, save the status of the work in progress, and transfer control to a special routine, known as an interrupt handler, that causes a particular set of instructions to be carried out.

Figure 3:
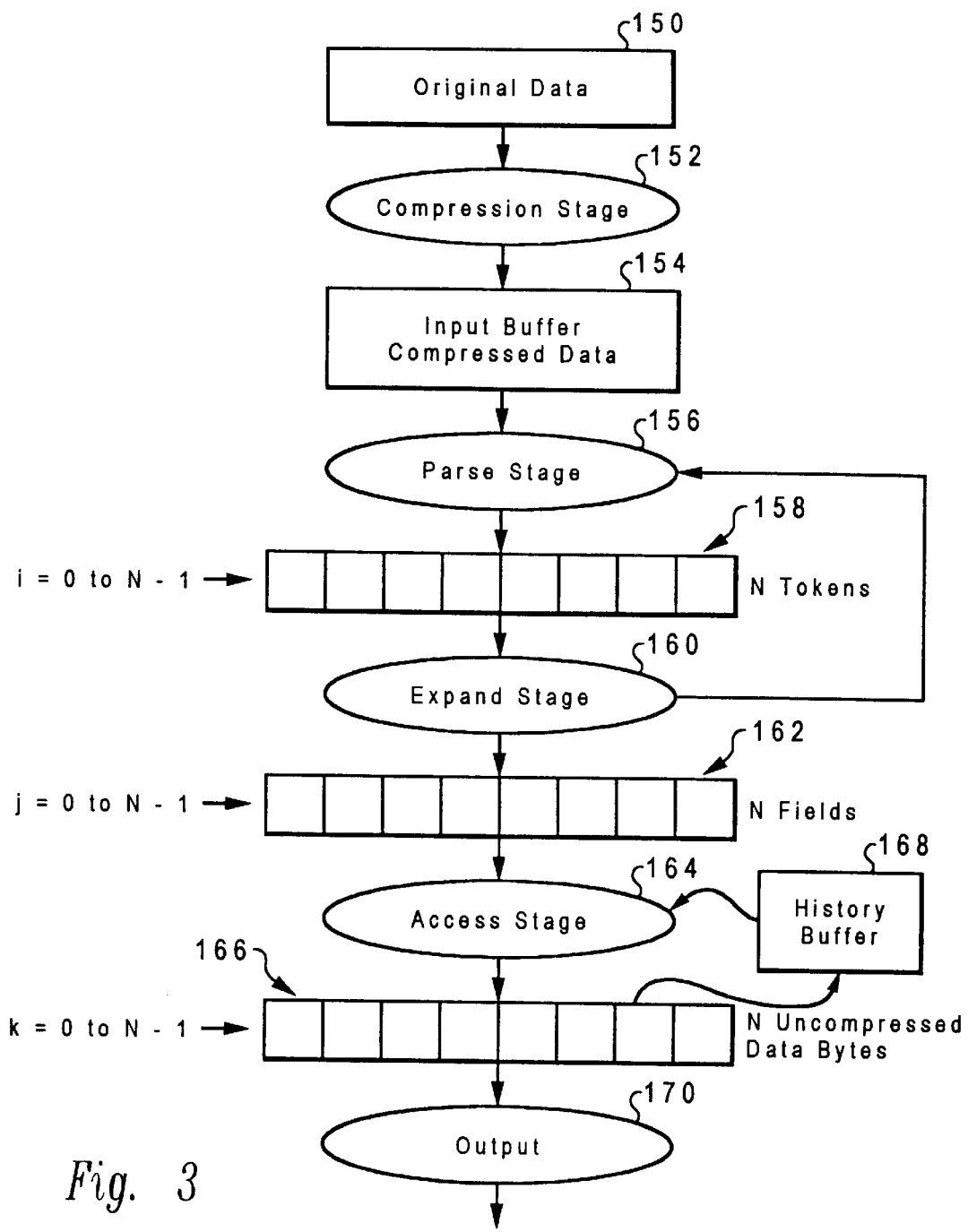
FIG. 3 is a block diagram that depicts an overview of the processing stages of the method and system of the present invention.

With reference now to FIG. 3, there is depicted a high-level block diagram that shows an overview of the stages of processing in the method and system of the present invention. As illustrated, original data 150 is input to compression stage 152, wherein the original data is compressed according to a Lempel-Ziv-type compression algorithm. Compressed data is then stored in input buffer 154. Compressed data is generally stored as one of two types of tokens; either a raw-byte token or a string token. Raw-byte tokens include one byte of original data. String tokens have two parts—a pointer and a length—and represent a string of original data that is stored in the history buffer.

Parse stage 156 separates data from input buffer 154 into tokens. According to some Lempel-Ziv compression algorithms, tokens may have a variable length, which usually varies according to the number of bits that represent the length part of a string token. For example, string tokens that represent a short sequence of data may include just two bits in the length part of the string token. Other string tokens may represent a string having a length over 270 bytes long and have a length part that includes 12 bits. The pointer or displacement part of a string token typically has a fixed length that includes a number of bits necessary to address, or point to, all byte locations in the history buffer, which has a predetermined size. For example, a 1 K-byte history buffer requires a 10-bit pointer, and a 2 K-byte history buffer uses an 11-bit pointer.

As part of the process of separating variable-length tokens, the parse stage logic must be able to barrel-shift the compressed data by a variable number of bit counts during every clock cycle. The output of parse stage 156 is N number of tokens 158 that are each stored in Field i, wherein i is equal to zero to N−1.

Expand stage 160 receives N tokens 158 from parse stage 156. Expand stage 160 determines how many tokens 158 are required for generating N bytes of decompressed data during a cycle at the output of the process, wherein N is greater than 1. For example, to produce eight bytes of decompressed data during a particular cycle, expand stage 160 can load eight raw-byte tokens 158, or two raw-byte tokens and one string token having a length of six, or three raw-byte tokens and the first five bytes of a string token that has a length of seven, or any other such combination of raw-byte tokens and string tokens. Because string tokens may be partially used by expand stage 160, string tokens must be corrected after taking part of the string so that the remaining part of the string may be used in the next cycle.

For example, if three bytes from an 8-byte string token are needed to produce N bytes in the present cycle, the 8-byte string may be divided into a 3-byte string token for use in the present cycle and a 5-byte string token for use in the next cycle, wherein the 3-byte string token points to the same location as the original 8-byte string token but has a length of three, and the remaining 5-byte string token points to the fourth location in the original 8-byte string token and has a length of five. Thus, longer string tokens may be converted to shorter string tokens in order to provide a full complement of N bytes during a particular cycle.

In another embodiment, string tokens may be converted to "single-byte string tokens," wherein such a single-byte string token has a length of one and includes a single-byte pointer that points to one byte, which may be stored in the history buffer. As expand stage 160 calculates the number of tokens that will provide N bytes of decompressed data during a single cycle, expand stage 160 requests additional tokens from parse stage 156. The output of expand stage 160 is a number of tokens needed to provide N tokens in a single cycle. Such tokens are stored in N fields 162 wherein such fields are addressed as field j, j having a value from zero to N−1.

Access stage 164 receives N tokens stored in fields 162 from expand stage 160. Access stage 164 passes data in raw-byte tokens through to output buffer 166, and determines whether string tokens in fields 162 point to data that has already been loaded into history buffer 168, or point to raw data in a field 162 that has not been loaded into history buffer 168. Once original data has been recovered from either the history buffer or fields 162, N uncompressed data bytes in output buffer 166 are sent to output stage 170 and also stored sequentially in history buffer 168. Bytes in output buffer 166 are referred to by the variable k, wherein k equals zero to N−1, and N is greater than 1.

Output stage 170 makes N uncompressed data bytes in output buffer 166 available to data processing system 20 during each cycle, wherein N is greater than 1.

Figure 4:
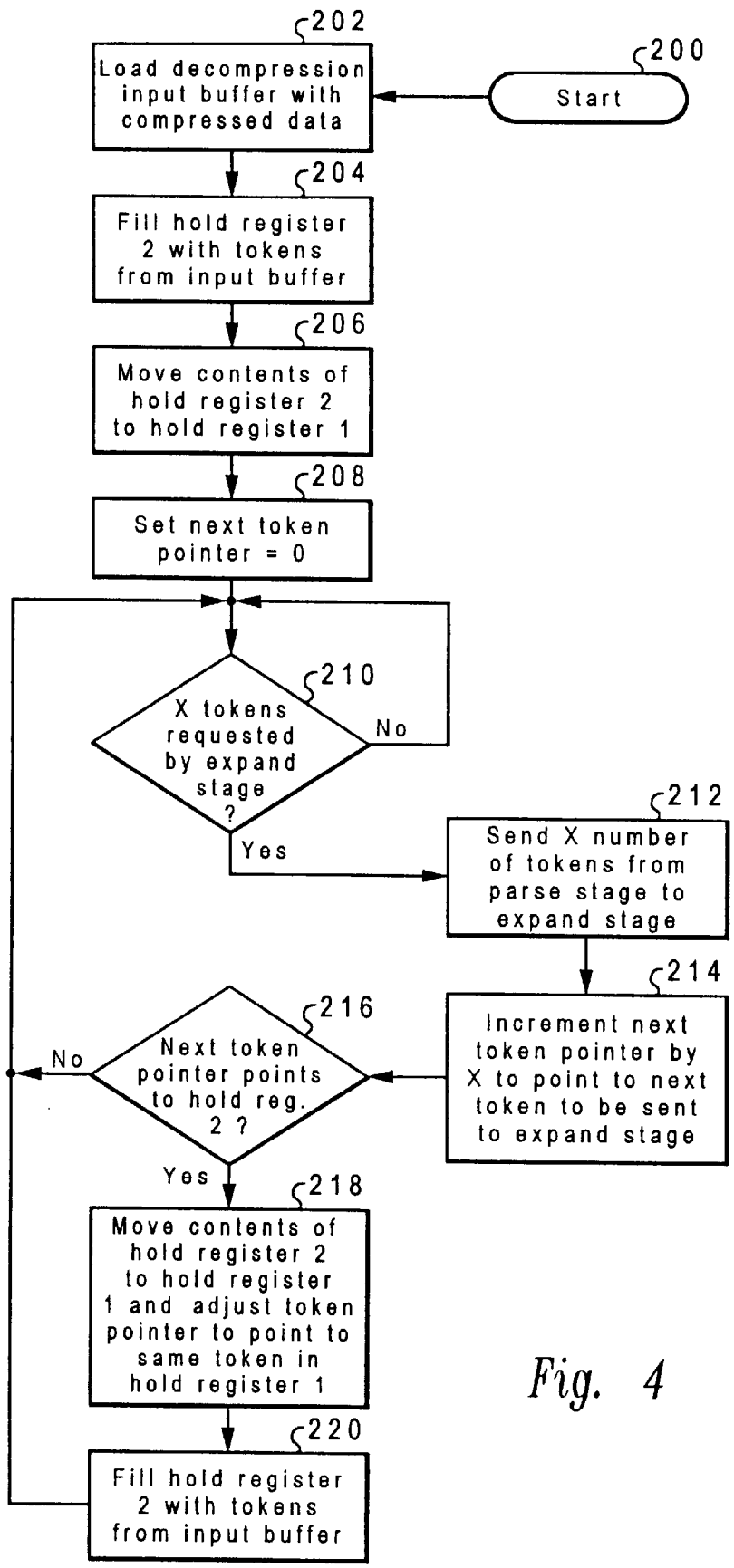
FIG. 4 is a high-level flow chart that illustrates the process of inputting compressed data into the parse stage of the method and system of the present invention.
Figure 5:
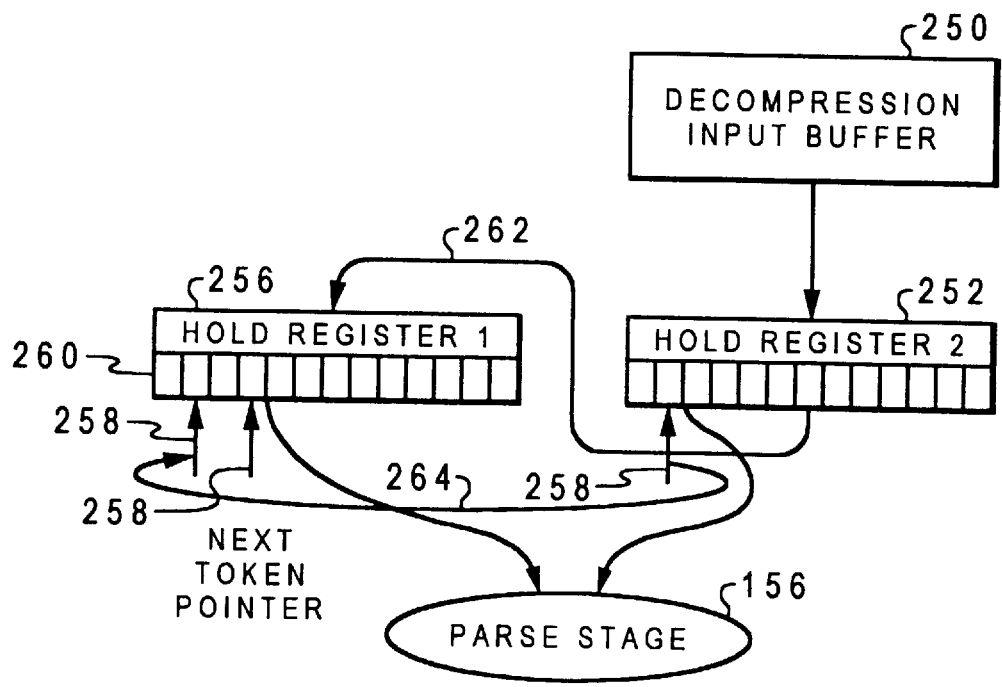
FIG. 5 is a high-level block diagram of a method of inputting data to the parse stage of the present invention.

Referring now to FIG. 4, there is depicted a high-level flowchart that illustrates the process of loading and parsing tokens in accordance with the method and system of the present invention. In order to provide a clearer description of the invention, FIG. 4 is discussed in conjunction with FIG. 5, which illustrates registers, buffers, and data flow used in the process illustrated by FIG. 4. As illustrated in FIG. 4, the process begins at block 200 and thereafter passage block 202, wherein the decompression input buffer is loaded with compressed data. Such data is compressed utilizing a Lempel-Ziv-type data compression algorithm. The decompression input buffer may be implemented as illustrated in FIG. 5 at reference numeral 250. Decompression input buffer 250 may be implemented in RAM 56, in high-speed cache memory coupled to CPU 50 (see FIG. 2), an internal buffer in an application specific IC (ASIC), or the like.

Next, hold register 2 252 (see FIG. 5) is filled with tokens from decompression input buffer 250. The contents of hold register 2 252 is then moved to hold register 1 256, as illustrated in block 206. Thereafter, next token pointer 258 is set to point to token zero 260, as depicted at block 208.

As illustrated at block 210, the process in the parse stage waits for the expand stage to request X number of tokens. If X number of tokens have not been requested, the process iteratively loops, as illustrated by the No branch at block 210. If X number of tokens have been requested by the expand stage, the process sends X number of tokens from the parse stage to the expand stage, as depicted at block 212. Thereafter, next token pointer 258 is incremented by X so that it points to the next token to be sent from the parse stage to the expand stage, as depicted at block 214.

The process then determines whether or not next token pointer 258 points to a location in hold register 2 252, as illustrated at block 216. If the next token pointer does not point to a token in hold register 2, the process returns to block 210 and waits for a request for new tokens from the expand stage.

If the next token pointer points to hold register 2, the process moves the contents of hold register 2, to hold register 1 and adjusts next token pointer to point to the same token, which has now been moved to hold register 1, as illustrated at block 218. This data flow from hold register 2 252 to hold register 1 256, and the adjustment of next token pointer 258 is illustrated at reference numerals 262 and 264 in FIG. 5. Thereafter, hold register 2 252 is filled with tokens from input buffer 250, as illustrated at block 220. After refilling hold register 2, the process returns to block 210 and waits for the expand stage to request new tokens, as illustrated in block 210.

Figure 6:
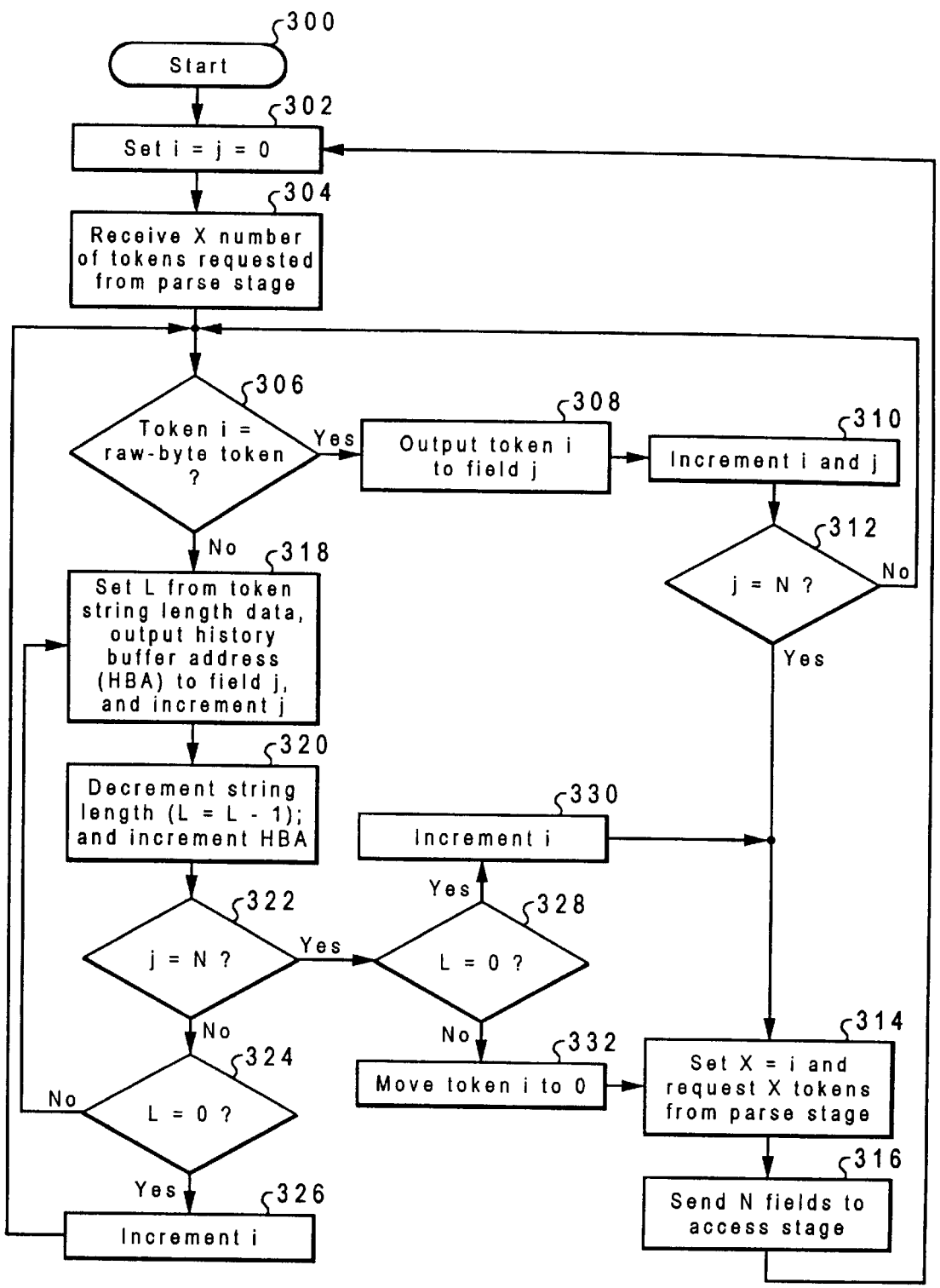
FIG. 6 is a high-level flowchart that illustrates the process of expanding tokens in an expand stage of the present invention.
Figure 7:
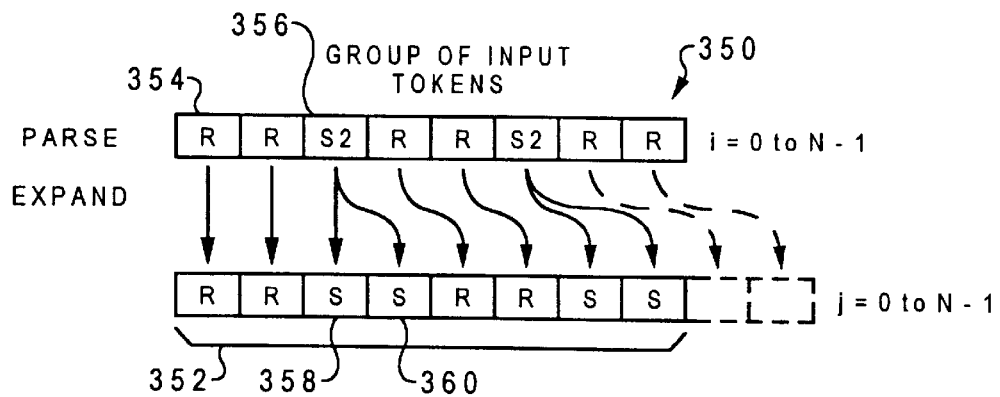
FIG. 7 is a high-level block diagram showing registers and data flow in the expand stage of the present invention.

With reference now to FIG. 6, there is depicted a high-level flow chart illustrating the process conducted in the expand stage in accordance with the method and system of the present invention. To provide a better understanding of FIG. 6, the registers and data flow that are illustrated in FIG. 7 are referenced when it is deemed helpful. As illustrated, the process begins at block 300 and thereafter passes to block 302, wherein the process sets pointers i and j equal to zero. Thereafter, the process receives X number of tokens that were requested from the parse stage, as depicted at block 304. Initially, X is set equal to N so that N tokens are requested as the process first begins. Thereafter, X is set equal to the number of tokens used to buy the expand stage in the previous cycle. Such tokens are typically received in an input buffer to the expand stage, such as input buffer 350 in FIG. 7. After receiving X number of tokens, input buffer 350 has been filled so that N number of tokens are available for processing in the expand stage.

Next, the process determines whether or not the token pointed to by pointer i is a raw-byte token, as illustrated at block 306. If such token i is a raw-byte token, the process outputs token i to field j in an output buffer from the expand stage, as depicted at block 308. Such an output buffer may be implemented as output buffer 352, which is shown in FIG. 7. Also shown in FIG. 7 is raw-byte token 354 which is copied from input buffer 350 to a selected field in output buffer 352. Thereafter, the process increments both i and j pointers, as illustrated at block 310. The process then determines whether or not output buffer 352 from the expand stage has been filled with N tokens, as depicted at block 312. If output buffer 352 from the expand stage has not been filled with N number of tokens, the process returns to block 306 to examine the next token input into the expand stage.

If however, output buffer 352 from the expand stage has been filled with N tokens, the process sets X equal to i and requests X number of tokens from the parse stage, as illustrated in block 314. At this point in the flow, X is the number of tokens used by the process in the FIG. 6 flowchart to insure N bytes of decompressed data will be output in a single cycle. Finally, as depicted at block 316, the process sends the N fields in output buffer 352 from the expand stage to the input of the access stage for further processing.

With reference again to block 306, if the process determines that token i is a string token, rather than a raw-byte token, the process sets the variable L equal to the string length of the string token i, outputs the history buffer address (HBA) from the string token to field j in expand stage output buffer 352, and increments j to point to the next field in expand stage output buffer 352, as illustrated in block 318. Thereafter, the process decrements the string length L and increments the history buffer address, as depicted at block 320. Those persons skilled in the art should realize that the process described in relation to block 318 creates a "single-byte string token" from a string token that represents multiple bytes of decompressed data. Such a single-byte string token includes a pointer that points to other data, and a length that is set equal to one to represent a "string" of length one.

As illustrated at block 322, the process then determines whether or not the output buffer from the expand stage 352 has been filled with N number of tokens such that N bytes of decompressed data may be later output in a single cycle. If output buffer 352 from the expand stage has not been filled with N bytes, the process then determines whether or not additional single-byte string tokens may be extracted from the string token that the previous single-byte string token came from, as depicted at block 324. If additional single-byte string tokens may be converted from the same input string token, the process returns to block 318 to continue converting the input string token to single-byte string tokens. In FIG. 7, string token 356 has a length of 2 in input buffer 350, and has been converted to 2 single-byte string tokens 358 and 360 in output buffer 352.

If the input string token has been completely converted to single-byte string tokens, and the expand stage output buffer has not been filled with N number of bytes, the process increments the i pointer, as illustrated at block 326, and returns to block 306 to examine and process the next token.

Referring again to block 322, wherein the process has determined that the expand stage output buffer 352 has been filled with N number of tokens, the process then determines whether or not the input string token has been completely converted to single-byte string tokens, as depicted at block 328. If the input string token has been completely converted to single-byte string tokens, the process increments the input token pointer; as illustrated at block 330, and proceeds to request new tokens from the parse stage and send N tokens to the access stage, as depicted at blocks 314 and 316.

If, at block 328, the process determines that the input string token has not been completely converted to single-byte string tokens, the process moves token i to location zero in the input buffer 350, as illustrated at block 332, so that the remaining portion of the input string token may be converted to single-byte string tokens during the next cycle. The process then continues at blocks 314 and 316, as described above.

Those persons skilled in the art should realize that the i pointer is not incremented in the NO path from block 328 because the process of converting the input string token to single-byte string tokens was not complete when the expand stage output buffer was filled with N tokens. Thus, additional processing will continue on the input string token during the next cycle. Persons skilled in the art should also note that if a string token having a large length is input, the process of converting such a string token to single-byte string tokens may require several cycles, and thus the request for X number of tokens from the parse stage described in relation to block 314 may request zero tokens from the parse stage for several cycles until the lengthy string token has been completely converted to single-byte string tokens. Additionally, N is the greatest number of tokens that will be requested from the parse stage, and this request for N tokens occurs when all input tokens in the previous cycle were raw-byte tokens and i is incremented N number of times in the flow path containing block 310.

While the embodiment of the present invention described in relation to FIG. 6 converts input string tokens to single-byte string tokens, other embodiments of the present invention may fill the output buffer from the expand stage with less than N number of tokens, but still have a number of tokens in the output buffer of the expand stage that represents N bytes of decompressed data, so that the access stage can fulfill the goal of outputting N number of bytes of decompressed data in a single cycle.

Figure 9:
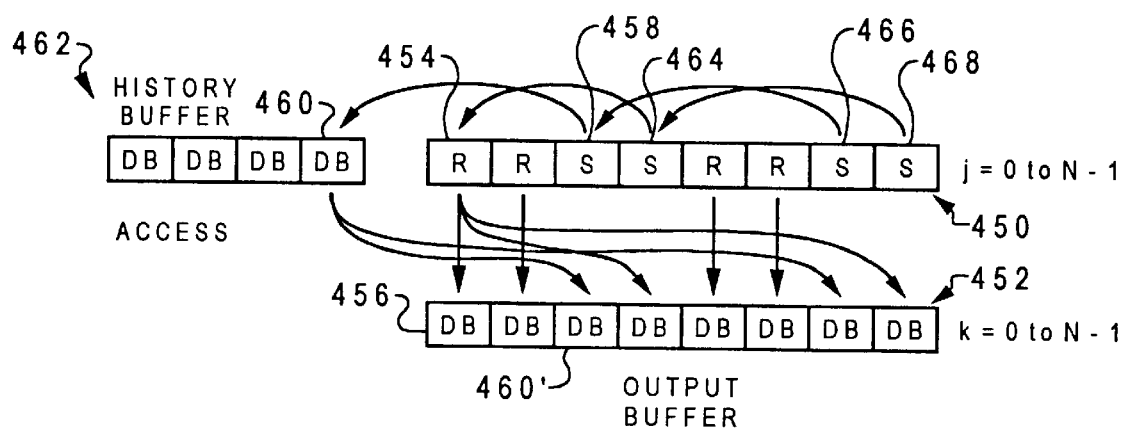
FIG. 9 is a high-level block diagram showing pointers, registers, and data flow during the access stage of the present invention.
Figure 8:
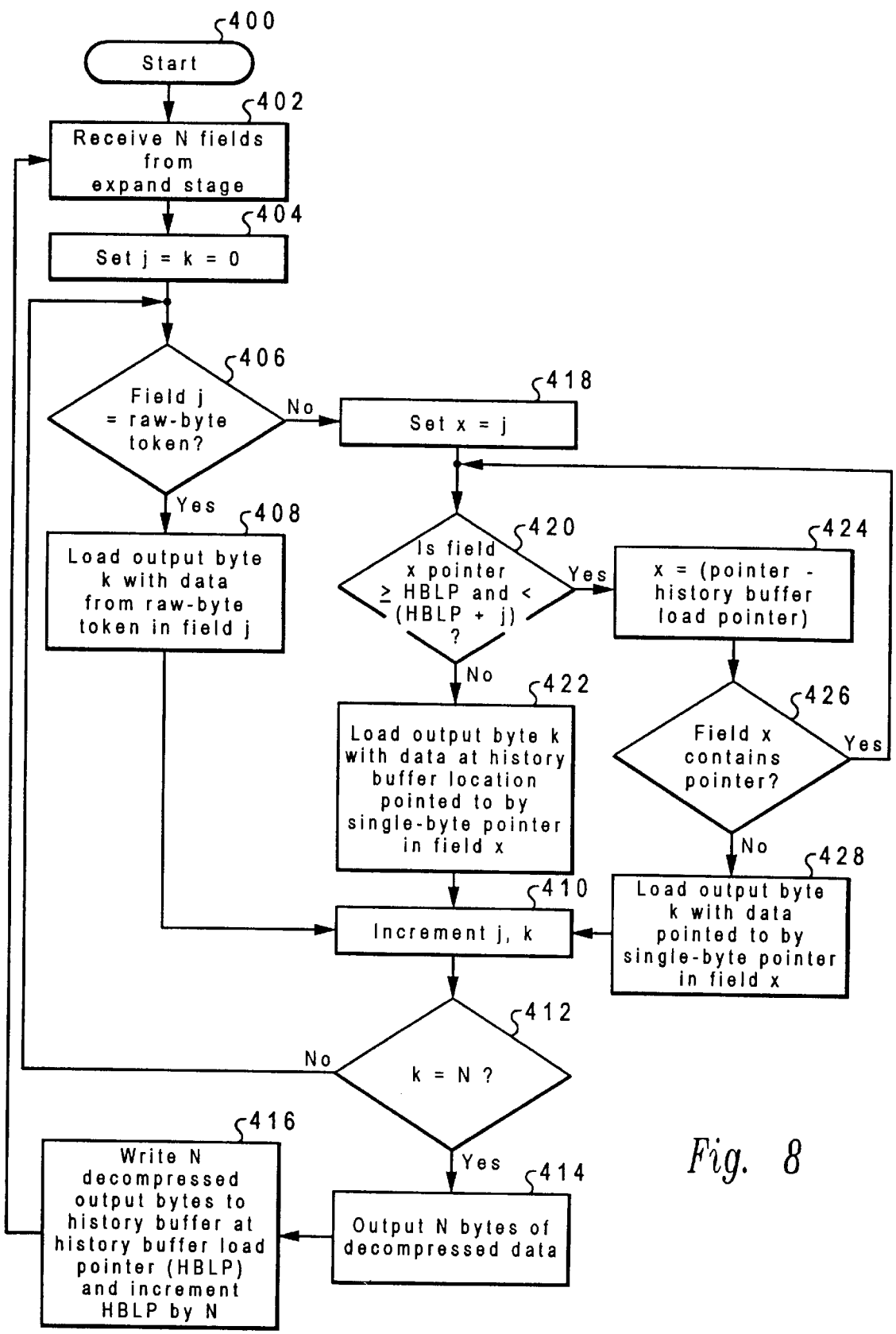
FIG. 8 is a high-level flowchart that illustrates the process executed in the access stage of the present invention.

With reference now to FIG. 8, there is depicted a high-level flowchart that illustrates the process executed in the access stage in accordance with the method and system of the present invention. In order to provide clear understanding of this flowchart, FIG. 8 is described in conjunction with references to FIG. 9 where it is deemed helpful. As illustrated in FIG. 8, the process begins at block 400 and thereafter passes to block 402, wherein the process receives N number of fields from the output buffer from the expand stage. Thereafter, the process sets a j variable, which points to the input fields from the expand stage, and a k variable, which points to bytes in the output buffer from the access stage, equal to zero, as illustrated in block 404. Such input fields are shown in FIG. 9 at input fields 450, and such an output buffer is shown at output buffer 452.

Next, the process determines whether or not field j contains a raw-byte token, as depicted at block 406. If field j contains a raw-byte token, the process loads output byte k with data from raw-byte token in field j, as illustrated at block 408. This step is also illustrated in FIG. 9 wherein raw-byte token 454 in input fields 450 is converted to decompressed byte 456 in output buffer 452. Thereafter, the process increments j and k, as depicted at block 410, and determines whether or not output buffer 452 (see FIG. 9) has been filled with N bytes of decompressed data, as illustrated at block 412.

If output buffer 452 has not been filled with N bytes of decompressed data, the process returns to block 406 to process and examine the token in the next field of data received from the expand stage. If, however, output buffer 452 has been completely filled with N bytes of decompressed data, the process outputs the N bytes of decompressed data for use by data processing system 20 (FIG. 1)

as depicted at block 414. Those persons skilled in the art should note that the method and system of the present invention outputs at least N bytes of decompressed data during each cycle of data processing system 20.

After outputting N bytes of decompressed data for the present cycle, the process writes, in sequential order, N decompressed output bytes to the history buffer at the history buffer load pointer (HBLP) and increments the HBLP by N counts, as illustrated at block 416. Writing N decompressed output bytes to the history buffer may be accomplished with various circuits. For example, in a first circuit, a typical random access memory (RAM) used as the history buffer may be written to N times in a cycle. Note that writing N decompressed output bytes to the history buffer must be done in the same cycle that data is read from the history buffer. Such a RAM must operate much faster than the remaining logic in the decompression system in order to support writing N bytes every cycle. In a second circuit, N 2-port RAMs may be used to implement the history buffer, wherein each RAM stores a full copy of the history buffer. During each cycle, different bytes may be read one byte at a time from each RAM while N decompressed bytes are written into each RAM during each cycle. In a third circuit, a RAM having a custom design is used to support N 1-byte read ports and one N-byte write port. Therefore, in the third circuit, a starting address is provided by the history buffer load pointer and N bytes are written to memory via a single N-byte write port. A history buffer that supports simultaneous reading and writing is advantageous because some stages in the decompression process read data from the history buffer while other stages write data to the history buffer within the same cycle.

After writing N bytes of decompressed data to the history buffer, the process returns to block 402 to receive the next N tokens from the expand stage for processing during the next cycle.

With reference again to block 406, if the process determines that field j contains a single byte string token, the process sets an X variable equal to j, as depicted at block 418. Such an X variable is a temporary variable used in FIG. 8 to point to one of the N tokens received from the expand stage.

Next, the process determines whether or not the single-byte string token in field X has a pointer that is greater than or equal to the history buffer load pointer and less than the history load pointer plus j, as illustrated at block 420. By determining whether or not the pointer points to a region in the history buffer between the history buffer buffer load pointer plus by buffer load pointer plus j, the process can determine whether the single-byte pointer points to current data stored in the history buffer or points to data, or another pointer, within a token just received from the expand stage. If the pointer points to a raw-byte token received in this cycle from the expand stage, the data in the history buffer at the single-byte pointer location is not the most current data—data in the raw-byte token received in this cycle from the expand stage is the most current data, and should be output to the output buffer.

Once the process has determined that the pointer in the single-byte string token in field X points to a valid data byte in the history buffer, the process loads output byte k with data stored at the history buffer address pointed to by the single byte pointer in field X, as depicted at block 422. Such reading from the history buffer may be implemented as discussed above. This step is also shown in FIG. 9 wherein single-byte string pointer 458 points to decompressed byte 460 in history buffer 462, and decompressed byte 460 is loaded in output buffer 452 as shown at decompressed byte 460'. Thereafter, the process continues at blocks 410 through 416, as described above.

With reference again to block 420, if the process determines that the field X single byte pointer points to the location in the history buffer that is not current, the process selects a new field X within the group of N fields received from the expand stage by subtracting the history buffer load pointer from the single-byte pointer in the current field X, as illustrated at block 424. Therefore, at block 424, a single-byte pointer is now pointing to another one of the N fields received from the expand stage, which may contain a raw-byte token that contains data that has not yet been written into the history buffer, or which may contain another single-byte pointer.

Next, the process determines whether or not the new field X of the N fields received from the expand stage contains a raw-byte token or a single-byte string token, as depicted at block 426. If field X contains a single-byte pointer, field X contains a single-byte string token rather than a raw-byte token. If the process determines that field X contains a single-byte pointer, the process returns to block 420 to determine whether or not the pointer points to current data in the history buffer, as described above. This case of a single-byte string token pointing to a raw-byte token not yet written to the history buffer is shown in FIG. 9 at single-byte string token 464. Alternatively, the single-byte string token will point to another single-byte string token, as illustrated by single-byte string token 466 that points to single-byte string token 458 that points to decompressed byte 460 in history buffer 462, or as illustrated by single-byte string token 468 that points to single-byte string token 464 that points to raw-byte token 454. One string token pointing to another string token that eventually points to a raw-byte token or current data in the history buffer may be referred to as "indirect pointing" by an "indirectly pointing" string token.

If, at block 426, the process determines that the single-byte pointer points to a raw-byte token in the group of N fields received from the expand stage, the process loads output byte K with data in the raw-byte token pointed to by the single-byte pointer in field X, as illustrated at block 428.

Thereafter, the process continues at blocks 410 through 416, as described above.

Figure 10:
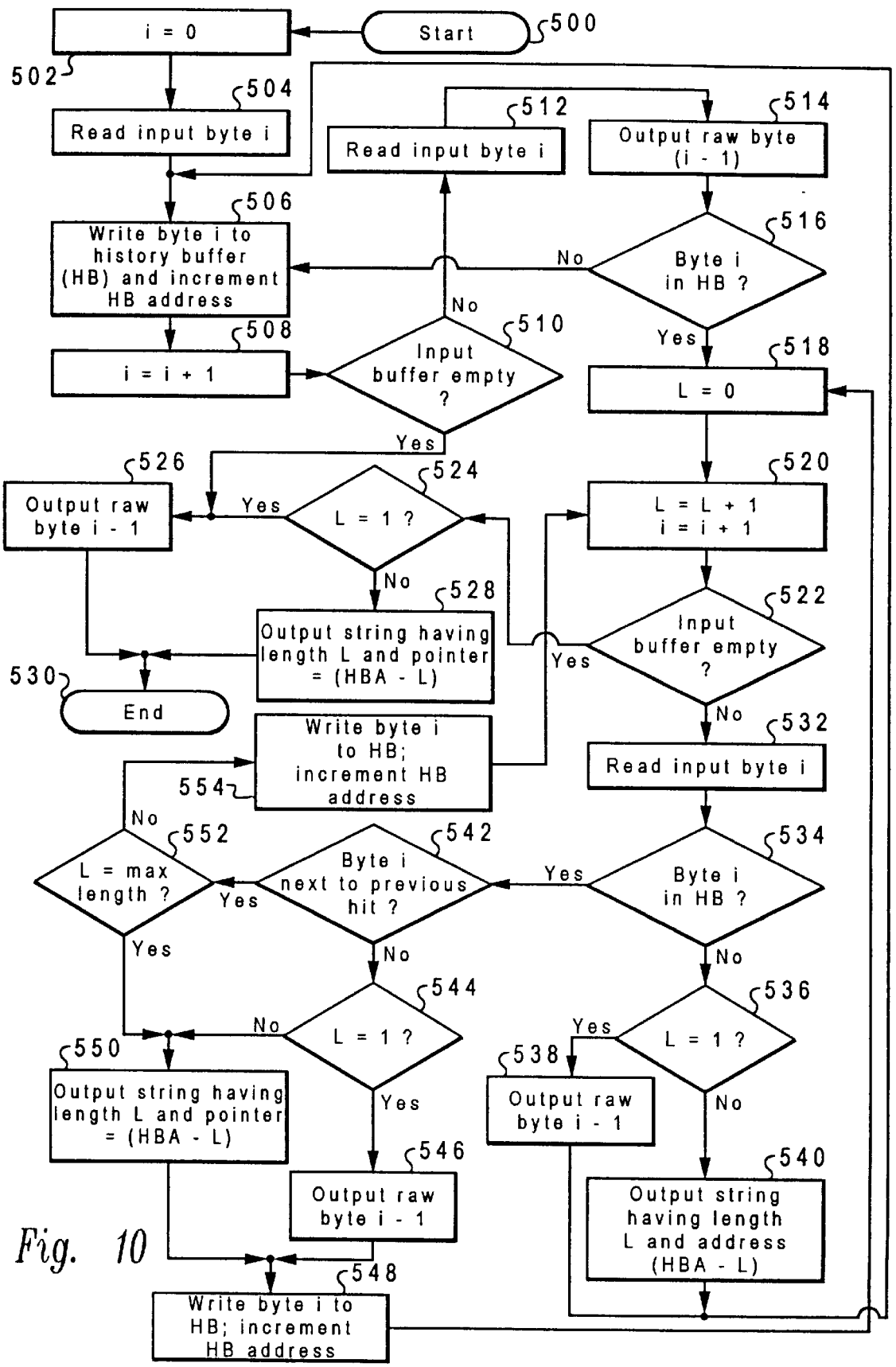
FIG. 10 is a high-level flowchart that illustrates the process of compressing data in accordance with the method and system of the present invention.

With reference now to FIG. 10, there is depicted a high-level flowchart illustrating the process of compressing input data with a Lempel-Ziv-type algorithm in accordance with the method and system of the present invention. As illustrated, the process begins at block 500 and thereafter passes to block 502 wherein pointer i is set to zero. Next, the process reads input byte i from an input buffer, as illustrated at block 504. Byte i is then written into the history buffer and the history buffer address is incremented, as depicted at block 506. Next, i is incremented as illustrated at block 508.

Next, the process determines whether or not the input buffer is empty, as depicted at block 510. If the input buffer is empty, the process outputs a raw-byte token containing data byte i−1, as illustrated at block 526. In accordance with an important aspect of the present invention, all raw-byte tokens have the same predetermined number of bits as all other raw-byte tokens. That is, all raw-byte tokens have a fixed length, or a fixed number of bits in the token. In one embodiment of the present invention, such a predetermined number of bits is equal to 10. The designer may select any number of bits for the predetermined number of bits in a raw-byte token so long as input bytes may be represented in the raw-byte token and selected bits in the raw-byte token may be used to differentiate raw-byte tokens from string tokens or other control data in the compressed data file. The process then ends as depicted at block 530.

With reference again to block 510, if the process determines that the input buffer is not empty, the process reads the next input byte i, as illustrated at block 512. Next, the process outputs a raw-byte token containing data byte i−1, which is the previous byte, as depicted at block 514. Such a raw-byte token contains the same predetermined number of bits as all other raw-byte tokens.

The process then determines whether or not the current byte—byte i—has a matching byte stored in the history buffer, as illustrated at block 516. If the current byte does not match a byte already stored in the history buffer, the process writes the current byte into the history buffer and increments the history buffer address, as depicted at block 506. The process then continues at block 508, as described above.

With reference again to block 516, if the process determines that byte i, the current byte, has a matching byte currently stored in the history buffer, the process sets L, a length variable, equal to zero, as depicted at block 518. As illustrated at block 520, the process then increments L and i. The length variable, L, is used to accumulate the length of a string of matching bytes that has been detected in the history buffer.

Next, the process determines whether or not the history buffer is empty, as illustrated at block 522. If the history buffer is empty, the process determines whether or not the string length L equals one, as depicted at block 524. If the string length equals one, the process outputs a raw-byte token containing byte i−1, as illustrated at block 526, and the process terminates at block 530. The raw-byte token containing byte i−1 contains the same predetermined number of bits as all other raw-byte tokens.

If, however, the process determines that the string length is greater than one, the process outputs a string token having the length L represented in the string token and a string pointer equal to (the history buffer address −L), as depicted at block 528. In accordance with an important aspect of the present invention, all string tokens have the same predetermined number of bits as all other string tokens. That is, all string tokens have a fixed length, or a fixed number of bits in the token. The predetermined number of bits in the string tokens may or may not equal the predetermined number of bits used in the raw-byte tokens. However, if the string tokens and raw-byte tokens use the same number of predetermined bits, the parse stage used in data decompression is able to efficiently and quickly separate string tokens and raw-byte tokens by counting the number of bits in each of the fixed length tokens.

In one embodiment of the present invention, the predetermined number of bits used for string tokens is equal to 10. With 10 bits in a string token, the first four bits may be used to indicate the length of the string "L," and the remaining six bits may be used to point to the beginning of the string in the history buffer. Of course, the size of the history buffer used in a particular design prescribes the number of bits that must be used for the pointer. As a larger history buffer is selected, fewer number of bits within the 10-bit fixed length are available for the length portion of the string token. Conversely, smaller history buffer sizes permit a larger number of bits to be used in the length portion of the 10-bit string token. If both longer strings and a larger history buffer are desired, more than 10 bits may be used as the predetermined number of bits in all string tokens. Thereafter, the process ends, as illustrated at block 530.

With reference again to block 522, if the process determines that the input buffer is not empty, the process reads the next input byte, byte i, as illustrated at block 532. Thereafter, the process determines whether or not the current byte, byte i, has a matching byte stored in the history buffer, as depicted at block 534. If byte i does not match a byte stored in the history buffer, the process determines whether or not the current string has a length of one, as illustrated at block 536. If the current string has a length of one, the process outputs a raw-byte token containing byte i−1, as depicted at block 538. This raw-byte token contains the same number of predetermined bits as all other raw-byte tokens. Thereafter, the process returns to block 506 to write byte i in the history buffer and increment the history buffer address. If, at block 536, the process determines that the string length is greater than one, the process outputs a string token having a length L and a pointer equal to (the history buffer address−L), as illustrated at block 540. This string token has the same predetermined number of bits as all other string tokens. After outputting the string token, the process similarly returns to block 506 to write byte i to the history buffer.

With reference again to block 534, if the process determines that byte i matches a byte stored in the history buffer, the process then determines whether or not byte i matches a byte stored next to a previous match in the history buffer so as to form a string, as depicted at block 542. If the present matching byte is not located next to a previously stored byte, the process then determines whether or not the current string length equals one, as illustrated at block 544. If the current string length is equal to one, the process outputs a raw-byte token containing byte i−1, as depicted at block 546. This raw-byte token contains the same predetermined number of bits as all other raw-byte tokens. Thereafter, the process writes byte i to the history buffer and increments the history buffer address, as illustrated at block 548. After writing to the history buffer, the process sets the string length equal to zero and continues to read in the next byte, as described above with reference to block 518 and following blocks.

With reference again to block 544, if the process determines that the current string length is greater than one, the process outputs a string token having a length L and a pointer equal to (the history buffer address−L), as depicted at block 550. This string token has the same predetermined number of bits as all other string tokens. Thereafter, the process writes byte i to the history buffer, as illustrated at block 548, and continues processing as described above.

With reference again to block 542, if the process determines that byte i has a matching byte stored next to a previously stored byte in the history buffer, the process continues to build the current string by determining whether or not the length of the string is equal to the maximum string length, as depicted at block 552. Such a maximum string length may have been reached because the predetermined number of bits selected for the string token cannot support a pointer portion and a length portion that totals more than the predetermined number of bits. In other words, a string having a greater length than the maximum string length would require additional bits in the string token, thereby exceeding the same predetermined number of bits for all string tokens. If the string length has not reached the maximum string length, the process writes byte i to the history buffer and increments the history buffer address as illustrated at block 554. Thereafter, the process returns to block 520 to continue processing the current string, as described above.

With reference again to block 552, if the process determines that the string length has reached the maximum string length, the process outputs a string token having maximum length L and a pointer equal to (the history buffer address– L), as illustrated at block 550. This string token has the same predetermined number of bits as all other string tokens. Thereafter, the process continues writing data to the history buffer and processing the remaining data in the input buffer at block 548, as described above.

Figure 11:
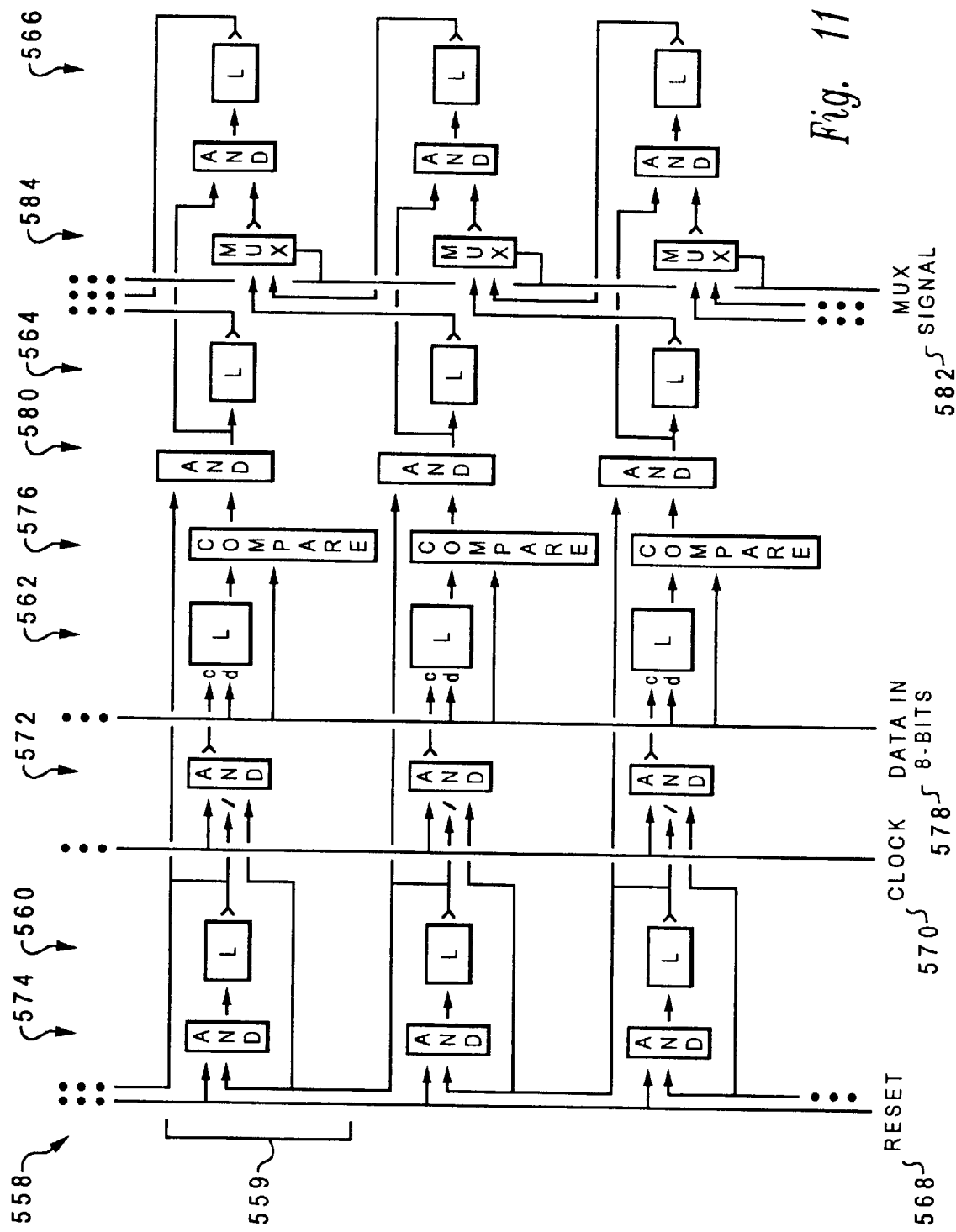
FIG. 11 is a high-level block diagram showing a content addressable memory history buffer for compressing data in accordance with the method and system of the present invention.

With reference now to FIG. 11, there is depicted a content addressable memory history buffer for use during Lempel-Ziv-Type-data compression in accordance with the method and system of the present invention. As discussed above, when a byte (8-bits) of data is sent to the Lempel-Ziv compression logic shown in FIG. 11, it is compared to the last Y bytes of data in the history buffer. Typical history buffer lengths, Y, are 512, 1024, or 2048 bytes. If a repeating sequence or string of bytes is found in the history buffer, then the number of bytes in the sequence, and the pointer or offset into the history buffer is stored in a string token.

The content addressable memory (CAM) history buffer shown in FIG. 11 stores and detects repeating strings of data. Such a CAM history buffer may be implemented in VHDL without the use of special macros.

History buffer 558 includes Y copies of the logic circuit shown at reference numeral 559. In this embodiment, the storage of each byte in the history buffer uses 11 memory elements (latches), four AND gates, one 2-way MUX, and an 8-way compare block. The eleven memory elements include one address latch 560, an 8-bit data latch 562, one result latch 564, and one store latch 566. All latches 560 through 566 are clocked whenever reset line 568 is valid and whenever a byte of data is being compressed. Clock signal 570 directly clocks all latches except for data latch 562. Data latch 562 is clocked through AND gate 572.

Address latch 560 is used as both an address select for writing data to the history buffer and as a compare-valid bit control signal. Reset line 568, through AND gate 574, sets all bits to zero in address latches 560 at the start of a compression sequence. As bytes are written into the history buffer, address latches 560 turn on sequentially. After all but one of the Y address latches 560 are turned on, a single zero is shifted through all address latches 560. Thus, address latches 560, for bits two through Y, act as a shift register, while bit one is set equal to one if Y–1 is off, otherwise bit Y is shifted into bit one. For every write to the history buffer, a single shift is executed.

Eight-bit data latch 562 stores bytes written into the history buffer. It is not necessary to reset data latches 562 at the beginning of a compression sequence. The byte currently being compressed is written into location (n) if address bit (n) is equal to 0, and the previous bit (n–1) is equal to 1. Also, location (n) is written if this is the first location (1) in the history buffer, and the history buffer is empty (i.e., the first and last address bit (1,Y) are equal to 0).

Result latch 564 is not reset at the beginning of a compression sequence. Result latch 564, for each location (n), directly latches the output of the compare function.

Store latch 566 is not reset at the beginning of a compression sequence. Store latch 566 for a location (n) directly latches either the output of compare function 580 logically ANDed with result latch 564 of the (n–1) location when a MUX signal 582 is active. A single MUX signal 582 controls all Y MUX gates 584. If any store latch bit 566 is active, then a data string match of two or more has been found. MUX signal 582 is held inactive for the following reasons:

1. During the first two writes of the history buffer at the beginning of a compression sequence.
2. For one write of the history buffer when a string of maximum length has occurred.
3. At any time all store latch bits 566 are inactive.

The compression control logic uses the history buffer as follows. Data is fed to the history buffer one byte at a time. If, after the two first cycles, any store latch bit 566 is active, then a string of two or more bytes has been found in the history buffer. If store latch bits 566 are not active, then the input byte from two cycles before is output from the compressor as a raw-byte token. Thus, anytime store latches 566 are all off for two cycles, a raw-byte token is output. If all store latch bits 566 are off, and at least one store latch bit 566 was on in the previous cycle, then a string token has just been concluded. The string length is calculated by counting the number of cycles store latch bits 566 were on, and the pointer for the string token is the smallest store latch bit (n) that was on in the previous cycle, minus the length plus one.

Data latch 562 at location (n) is compared, at reference numeral 576, to incoming data byte 578. Such a comparison is valid if and only if address latch 560 bit (n) is equal to 1.

Figure 12:
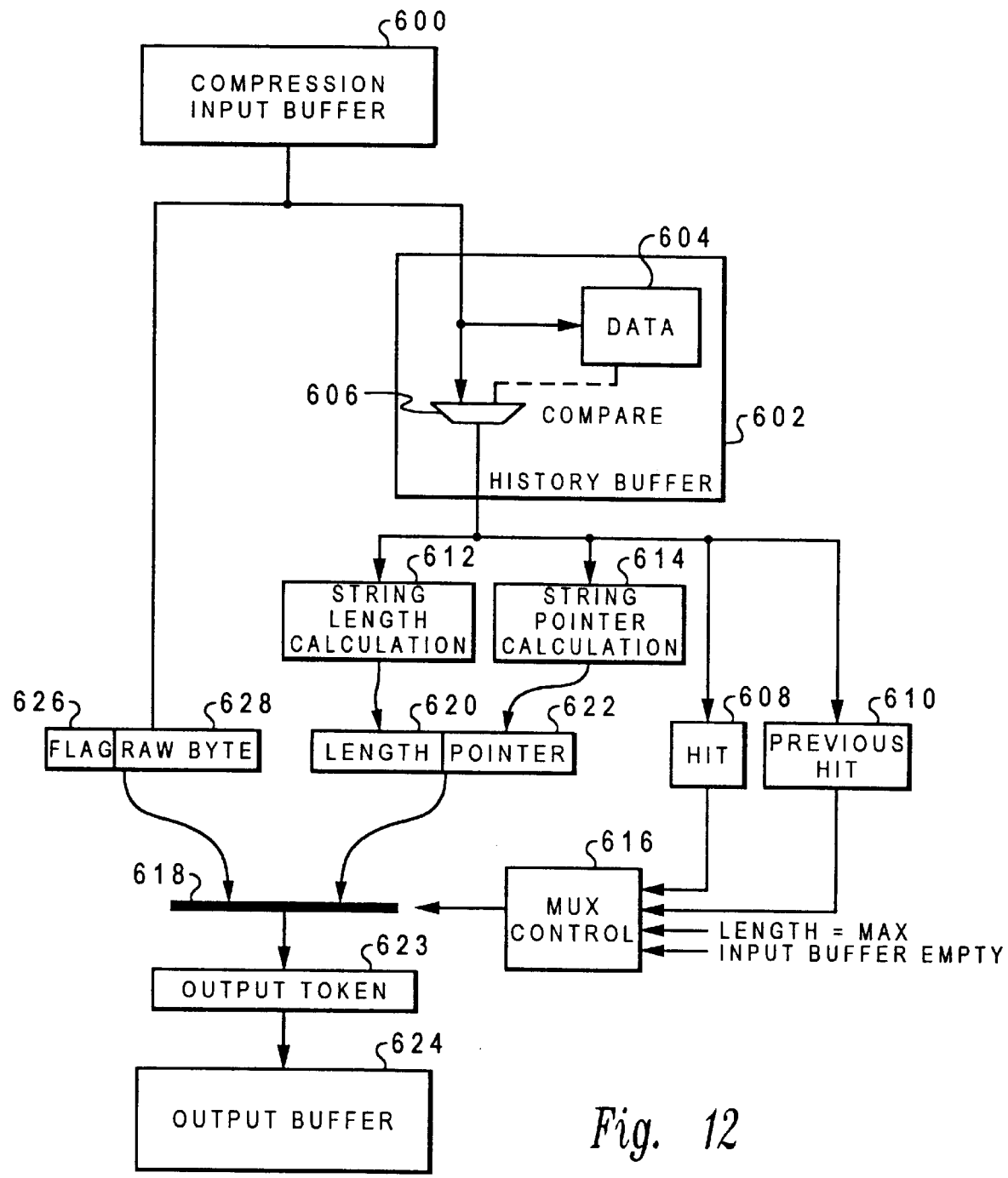
FIG. 12 is a high-level block diagram showing an apparatus for compressing data utilizing a content addressable memory history buffer in accordance with the method and system of the present invention.

And finally, with reference to FIG. 12, there is depicted a high-level block diagram of a system for compressing data that utilizes the content addressable memory history buffer shown in FIG. 11. Uncompressed data that is to be compressed is stored in compression input buffer 600. Data from compression input buffer is processed serially as described below. History buffer 602 may be implemented as described above and shown in FIG. 11. Thus, as data from compression input buffer 600 is processed, history buffer 602 stores data from compression input buffer 600 and aids in the detection of matching strings that have been previously processed. Data is stored in history buffer 602 in memory 604, and matching strings are located in history buffer 602 as shown by the compare function 606.

When new data from compression input buffer 600 matches data previously stored in history buffer 602 hit detection logic 608 is activated. Previous hit detection logic 610 is activated if the present byte matches a byte in memory 604 that immediately follows a byte that matched the previously processed byte. That is, the present byte continues to match bytes in a string in memory 604.

As new bytes from compression input buffer 600 continue to match bytes in a string in memory 604, string length calculation logic 612 maintains a count of the number of bytes in the currently forming string. String pointer calculation logic 614 calculates a pointer that points to the beginning of the matching string in memory 604.

If a new byte taken from compression input buffer 600 causes a miss and the previous byte from compression input buffer 600 caused a hit, MUX control logic 616 sets MUX 618 to output a string token having length 620 and pointer 622. A string token is also output if the input buffer is considered empty after processing the current byte from compression input buffer 600. And, a string token is output to output token buffer 623 if the currently forming string has reached a maximum string length. After being output from MUX 618, output tokens 623 are stored in output buffer 624. Therefore, output buffer 624 contains data in compressed form that represents data in compression input buffer 600.

If matching data is not found in history buffer 602, and there is no currently forming string, a raw-byte token is formed by adding a flag 626 to a raw data byte 628 to indicate that it is not a string token. Such a raw-byte token is then passed through multiplexer 618 to output token 623 and stored in output buffer 624.

In summary, the method and system for compressing data described above in accordance with the present invention compresses data to produce a compressed data set having a Lempel-Ziv compressed data format, wherein raw-byte tokens and string tokens each have a predetermined number of bits to facilitate high-speed parsing during data decompression. The same predetermined number of bits used for raw-byte tokens may or may not be the same predetermined number of bits used in string tokens. However, fastest parsing, using the least complicated circuitry, is provided when both raw-byte tokens and string tokens use the same the same predetermined number of bits. Providing a compressed data file that may be easily and quickly parsed into raw-byte and string tokens is particularly useful when such a data file must be quickly decompressed. Such an easily parsed compressed data file is especially useful when using new decompression techniques that decompress multiple bytes in a single machine cycle.

Aspects of this invention pertain to specific "method functions" implementable on computer systems. In an alternate embodiment, the invention may be implemented as a computer program product for use with a computer system. Those skilled in the art should readily appreciate that programs defining the functions of the present invention can be delivered to a computer in many forms. Such forms include, but are not limited to: (a) information permanently stored on non-writable storage media (e.g., read only memory devices within a computer such as ROM 58 or CD-ROM disks 78 readable by a computer I/O attachment); (b) information alterably stored on writable storage media (e.g., floppy disks 74 and hard drives 72); or (c) information conveyed to a computer through communication media such as network 94 and telephone networks via motem 92. It should be understood, therefore, that such media when carrying computer readable instructions that direct the method functions of the present invention, represent alternate embodiments of the present invention.

The foregoing description of a preferred embodiment of the invention has been presented for the purpose of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth they are fairly, legally, and equitably entitled.

What is claimed is:

1. A method in a data processing system for compressing data, wherein said data processing system includes a decompression history buffer for storing previously decompressed data and an output buffer for storing at least N bytes, wherein N is greater than 1, and wherein said data processing system receives a clock signal once per cycle, said method comprising the steps of:

receiving a group of input tokens from said compressed data buffer, wherein each of said input tokens is either a raw-byte token or a string token, and wherein each of said string tokens includes a pointer and a length;

outputting, to said output buffer, a decompressed byte from each of said raw-byte tokens within said group of input tokens;

determining whether each of said pointers in said string tokens points to data stored in said decompression history buffer or points to data within one or more of said raw-byte tokens within said group of input tokens that contain data not yet stored in said decompression history buffer;

for each of said pointers that points to data stored in said decompression history buffer, outputting, to said output buffer, decompressed bytes pointed to in said decompression history buffer by said pointer in combination with said length; and for each of said pointers that points to data within said raw-byte tokens within said group of input tokens, outputting, to said output buffer, a decompressed byte from each of said one or more raw-byte tokens pointed to by said pointer in combination with said length, wherein, during each of said cycles, at least N newly decompressed bytes are available in said output buffer for use by said data processing system.

2. The method in a data processing system for compressing data according to claim 1 further including the steps of:

converting each of said string tokens within said group of input tokens to one or more single-byte string tokens, wherein each of said single-byte string tokens includes a single-byte pointer and has a length equal to one byte;

determining whether each of said single-byte pointers points to data stored in said decompression history buffer or points to data within one of said raw-byte tokens within said group of input tokens;

for each of said single-byte pointers that points to data stored in said decompression history buffer, outputting, from said decompression history buffer to said output buffer, a decompressed byte pointed to in said decompression history buffer by said single-byte pointer; and for each of said single-byte pointers that points to data within one of said raw-byte tokens within said group of input tokens, outputting, from said group of input tokens to said output buffer, a decompressed byte from said raw-byte token pointed to by said single-byte pointer.

3. The method in a data processing system for compressing data according to claim 2 wherein said step of determining whether each of said single-byte pointers points to data stored in said decompression history buffer or points to data within one of said raw-byte tokens within said group of input tokens includes determining whether each of said single-byte pointers points indirectly to data within one of said raw-byte tokens within said group of input tokens, wherein such an indirectly pointing single-byte pointer points to a first one of said single-byte string tokens within said group of input tokens, and said first one of said single-byte string tokens points to data within one of said raw-byte tokens within said group of input tokens.

4. The method in a data processing system for compressing data according to claim 2 wherein said step of determining whether each of said single-byte pointers points to data stored in said decompression history buffer or points to data within one of said raw-byte tokens within said group of input tokens includes determining whether each of said single-byte pointers points indirectly to data stored in said decompression history buffer, wherein such an indirectly pointing single-byte pointer points to a first one of said single-byte string tokens within said group of input tokens, and said first one of said single-byte string tokens points to data within said decompression history buffer.

5. The method in a data processing system for compressing data according to claim 1 wherein said step of receiving a group of input tokens from said compressed data buffer includes receiving a group of input tokens from said compressed data buffer in response to a request for a number of tokens equal to the number of input tokens used for outputting N bytes during a previous one of said cycles, wherein N is greater than 1.

6. The method in a data processing system for compressing data according to claim 1 wherein said decompression history buffer includes a decompression history buffer load pointer that points to a next location for storing decompressed data in said decompression history buffer, and wherein said step of receiving a group of input tokens includes receiving a group of input tokens in a predetermined order, and wherein said method further includes the step of storing said at least N decompressed bytes, wherein N is greater than 1, in said decompression history buffer in said predetermined order, at locations in said decompression history buffer beginning at a location pointed to by said decompression history buffer load pointer.

7. A data processing system for compressing data, wherein said data processing system includes a decompression history buffer for storing previously decompressed data and an output buffer for storing at least N bytes, wherein N is greater than 1, and wherein said data processing system receives a clock signal once per cycle, said data processing system comprising:

means for receiving a group of input tokens from said compressed data buffer, wherein each of said input tokens is either a raw-byte token or a string token, and wherein each of said string tokens includes a pointer and a length;

means for outputting, to said output buffer, a decompressed byte from each of said raw-byte tokens within said group of input tokens;

means for determining whether each of said pointers in said string tokens points to data stored in said decompression history buffer or points to data within one or more of said raw-byte tokens within said group of input tokens that contain data not yet stored in said decompression history buffer;

means for outputting, to said output buffer, decompressed bytes pointed to in said decompression history buffer by said pointer in combination with said length in response to each of said pointers that points to data stored in said decompression history buffer; and means for outputting, to said output buffer, a decompressed byte from each of said one or more raw-byte tokens pointed to by said pointer in combination with said length in response to each of said pointers that points to data within said raw-byte tokens within said group of input tokens, wherein, during each of said cycles, at least N newly decompressed bytes are available in said output buffer for use by said data processing system.

8. The data processing system for compressing data according to claim 7 further including:

means for converting each of said string tokens within said group of input tokens to one or more single-byte string tokens, wherein each of said single-byte string tokens includes a single-byte pointer and has a length equal to one byte;

means for determining whether each of said single-byte pointers points to data stored in said decompression history buffer or points to data within one of said raw-byte tokens within said group of input tokens;

means for outputting, from said decompression history buffer to said output buffer, a decompressed byte pointed to in said decompression history buffer by said single-byte pointer in response to each of said single-byte pointers that points to data stored in said decompression history buffer; and means for outputting, from said group of input tokens to said output buffer, a decompressed byte from said raw-byte token pointed to by said single-byte byte pointer in response to each of said single-byte pointers that points to data within one of said raw-byte tokens within said group of input tokens.

9. The data processing system for compressing data according to claim 8 wherein said means for determining whether each of said single-byte pointers points to data stored in said decompression history buffer or points to data within one of said raw-byte tokens within said group of input tokens includes means for determining whether each of said single-byte pointers points indirectly to data within one of said raw-byte tokens within said group of input tokens, wherein such an indirectly pointing single-byte pointer points to a first one of said single-byte string tokens within said group of input tokens, and said first one of said single-byte string tokens points to data within one of said raw-byte tokens within said group of input tokens.

10. The data processing system for compressing data according to claim 8 wherein said means for determining whether each of said single-byte pointers points to data stored in said decompression history buffer or points to data within one of said raw-byte tokens within said group of input tokens includes means for determining whether each of said single-byte pointers points indirectly to data stored in said decompression history buffer, wherein such an indirectly pointing single-byte pointer points to a first one of said single-byte string tokens within said group of input tokens, and said first one of said single-byte string tokens points to data within said decompression history buffer.

11. The data processing system for compressing data according to claim 7 wherein said data processing system includes a compressed data buffer, and wherein said means for receiving a group of input tokens includes means for receiving a group of input tokens from said compressed data buffer in response to a request for a number of tokens equal to the number of input tokens used for outputting N bytes during a previous one of said cycles, wherein N is greater than 1.

12. The data processing system for compressing data according to claim 7 wherein said decompression history buffer includes a decompression history buffer load pointer that points to a next location for storing decompressed data in said decompression history buffer, and wherein said means for receiving a group of input tokens includes means for receiving a group of input tokens in a predetermined order, and wherein said data processing system further includes means for storing said at least N decompressed bytes, wherein N is greater than 1, in said decompression history buffer in said predetermined order, at locations in said decompression history buffer beginning at a location pointed to by said decompression history buffer load pointer.

13. A computer program product, for compressing data in a data processing system, wherein said data processing system includes a decompression history buffer for storing previously decompressed data and an output buffer for storing at least N bytes, wherein N is greater than 1, said computer program product comprising:

computer readable program code means for receiving a group of input tokens from said compressed data buffer, wherein each of said input tokens is either a raw-byte token or a string token, and wherein each of said string tokens includes a pointer and a length;

computer readable program code means for outputting, to said output buffer, a decompressed byte from each of said raw-byte tokens within said group of input tokens;

computer readable program code means for determining whether each of said pointers in said string tokens points to data stored in said decompression history buffer or points to data within one or more of said raw-byte tokens within said group of input tokens that contain data not yet stored in said decompression history buffer;

computer readable program code means for outputting, to said output buffer, decompressed bytes pointed to in said decompression history buffer by said pointer in combination with said length in response to each of said pointers that points to data stored in said decompression history buffer; and computer readable program code means for outputting, to said output buffer, a decompressed byte from each of said one or more raw-byte tokens pointed to by said pointer in combination with said length in response to each of said pointers that points to data within said raw-byte tokens within said group of input tokens, wherein, at least N newly decompressed bytes are available in said output buffer for use by said data processing system.

14. The computer program product according to claim 13 further including:

computer readable program code means for converting each of said string tokens within said group of input tokens to one or more single-byte string tokens, wherein each of said single-byte string tokens includes a single-byte pointer and has a length equal to one byte;

computer readable program code means for determining whether each of said single-byte pointers points to data stored in said decompression history buffer or points to data within one of said raw-byte tokens within said group of input tokens;

computer readable program code means for outputting, from said decompression history buffer to said output buffer, a decompressed byte pointed to in said decompression history buffer by said single-byte pointer in response to each of said single-byte pointers that points to data stored in said decompression history buffer; and computer readable program code means for outputting, from said group of input tokens to said output buffer, a decompressed byte from said raw-byte token pointed to by said single-byte pointer in response to each of said single-byte pointers that points to data within one of said raw-byte tokens within said group of input tokens.

15. The computer program product according to claim 14 wherein said computer readable program code means for determining whether each of said single-byte pointers points to data stored in said decompression history buffer or points to data within one of said raw-byte tokens within said group of input tokens includes computer readable program code means for determining whether each of said single-byte pointers points indirectly to data within one of said raw-byte tokens within said group of input tokens, wherein such an indirectly pointing single-byte pointer points to a first one of said single-byte string tokens within said group of input tokens, and said first one of said single-byte string tokens points to data within one of said raw-byte tokens within said group of input tokens.

16. The computer program product according to claim 14 wherein said computer readable program code means for determining whether each of said single-byte pointers points to data stored in said decompression history buffer or points to data within one of said raw-byte tokens within said group of input tokens includes computer readable program code means for determining whether each of said single-byte pointers points indirectly to data stored in said decompression history buffer, wherein such an indirectly pointing single-byte pointer points to a first one of said single-byte string tokens within said group of input tokens, and said first one of said single-byte string tokens points to data within said decompression history buffer.

17. The computer program product according to claim 13 wherein said data processing system includes a compressed data buffer, and wherein said computer readable program code means for receiving a group of input tokens includes computer readable program code means for receiving a group of input tokens from said compressed data buffer in response to a request for a number of tokens equal to the number of input tokens used for outputting a previous group of N bytes, wherein N is greater than 1.

18. The computer program product according to claim 13 wherein said decompression history buffer includes a decompression history buffer load pointer that points to a next location for storing decompressed data in said decompression history buffer, and wherein said computer readable program code means for receiving a group of input tokens includes computer readable program code means for receiving a group of input tokens in a predetermined order, and wherein said data processing system further includes computer readable program code means for storing said at least N decompressed bytes, wherein N is greater than 1, in said decompression history buffer in said predetermined order, at locations in said decompression history buffer beginning at a location pointed to by said decompression history buffer load pointer.

* * * * *